United States Patent [19]
Nam

[11] Patent Number: 5,850,148
[45] Date of Patent: Dec. 15, 1998

[54] VERTICAL PROBE CARD APPARATUS WITH MACRO-TENSION MODULE HAVING NOTCHED-SHAPED NEEDLE FOR SELF-BALANCING CONTACT

[76] Inventor: Jae W. Nam, 114-201, Byuck San Apt., Hong Eun-1 Dong, Seo Dae Moon-Gu, Seoul 120-101, Rep. of Korea

[21] Appl. No.: 689,093

[22] Filed: Aug. 5, 1996

[30] Foreign Application Priority Data

Aug. 17, 1995 [KR] Rep. of Korea ................... 95-25232

[51] Int. Cl.⁶ .................................................. G01R 31/02
[52] U.S. Cl. .......................... 324/761; 324/758; 324/754
[58] Field of Search .................................. 324/754, 755, 324/757, 758, 761

[56] References Cited

U.S. PATENT DOCUMENTS

| | | | |
|---|---|---|---|
| 3,806,801 | 4/1974 | Bove | 324/72.5 |
| 3,911,361 | 10/1975 | Bove et al. | 324/761 |
| 5,266,895 | 11/1993 | Yamashita | 324/757 |
| 5,325,052 | 6/1994 | Yamashita | 324/754 |
| 5,518,410 | 5/1996 | Masami | 439/71 |
| 5,525,911 | 6/1996 | Marumo et al. | 324/754 |
| 5,539,676 | 7/1996 | Yamaguchi | 364/559 |

*Primary Examiner*—Josie Ballato
*Assistant Examiner*—Russell M. Kobert
*Attorney, Agent, or Firm*—Workman, Nydegger, & Seeley

[57] ABSTRACT

The present invention relates to a probe card for testing the failure of a semiconductor IC chip. The probe card according to the present invention comprises a vertical needle module having an upper fixing plate and a lower fixing plate through which vertical-type needles are attached; a mass ring attached to the vertical needle module for smooth contact of the vertical-type needles with pads of a semiconductor IC chip; a guide ring for smooth movement of the mass ring and the vertical needle module and for protecting the mass ring and the vertical needle module against deviation in a downward direction; a space forming means for obtaining a movement space of the mass ring, in which the means is placed above the guide ring; and a probe card PCB, on which a signal pattern is formed, formed on the space forming means, thereby protecting the upper fixing plate from movements in a lateral direction and to protect the needle module against deviations in an upper direction. The probe card can make smooth contacts between the pads formed on an upper portion of a semiconductor IC chip and the vertical-type needles and is also capable of testing a multiple of semiconductor IC chips simultaneously.

22 Claims, 6 Drawing Sheets

5,850,148

VERTICAL PROBE CARD APPARATUS WITH MACRO-TENSION MODULE HAVING NOTCHED-SHAPED NEEDLE FOR SELF-BALANCING CONTACT

FIELD OF THE INVENTION

This invention relates to a probe card for testing failures of semiconductor IC chips formed on a wafer. More particularly, this invention relates to a probe card having vertical type needles which enables testing of a plurality of semiconductor IC chips simultaneously and to a method for manufacturing the same.

BACKGROUND OF THE INVENTION

Recently, as semiconductor IC chip manufacturing technology becomes more integrated and serves higher functions, the size of the IC chip has decreased. As a result, the following two testing methods have become required, in order to test failures of the IC chips.

The first method is a wafer probing test method in which IC chips are tested in a wafer state and the second method is a final test method in which IC packages are tested after IC chips of the wafer state are manufactured into package-type chips.

FIG. 1 shows a general wafer probing test system which can be used for the wafer probing test described above. Referring to FIG. 1, the wafer probing test apparatus comprises an IC chip test system 1 for testing IC chips in a wafer state; and an IC chip test head 2 which is electrically connected to the IC chip test system 1. The wafer 4 on which a semiconductor IC chip 4A is formed is mounted on top of a chuck 6, and the chuck 6 is disposed on a wafer probe station 7. A probe card 3A shown in FIG. 2A having horizontal needles 9 is set up between the IC chip test head 2 and the wafer 4. In order to test failures of the semiconductor IC chip 4A, pads 5 formed on the semiconductor IC chip 4A are contacted with the horizontal needles 9 mounted on the probe card 3A, as depicted in FIG. 2A and FIG. 2B. The probe card 3A having the horizontal needles 9 is electrically connected to the IC chip test head 2. Accordingly, the IC chip test system 1 can test for failures of the semiconductor IC chip 4A with the aid of the horizontal needles 9 mounted on the probe card 3A which are contacted with the pads 5.

A conventional probe card 3A on which the horizontal needles 9 are mounted is shown in more detail in FIGS. 2A and 2B.

Generally, each of the horizontal needles 9 has a length in the range of 40 to 50 mm and a diameter in the range of 200 to 250 μm. The horizontal needles 9 are made of a conductive metal, preferably tungsten (W), however beryllium-copper (Be—Cu) or paliney-7 (P-7) may also be used as the material for the horizontal needles 9, considering factors such as hardness, degree of wear and conductivity, etc. Also a metal plated with gold (Au) or copper (Cu) may also be used.

After the horizontal needles 9 having bent tips are manufactured from one of the materials described above, a needle module is completed by forming a probe ring 10 made of an epoxy resin for fixing the horizontal needles 9 onto the probe card 3A. Thereafter, the needle module is fixed onto a ready-made PCB of a probe card. Next, each of the horizontal needles 9 is fixed onto the signal pattern formed on the PCB by soldering. In this case, a microscope is required for working a series of processes necessary for manufacturing the needle module and fixing the horizontal needles 9 onto the PCB. Thus, it is very difficult to control the length of the horizontal needles 9 and to fix the positions thereof, when manufacturing the needle module.

It is also difficult to control and adjust the angle of the tips of the horizontal needles 9 when bending the tips. There are other difficulties such as a lengthy process for manufacturing the probe card and high failure rate of the probe card, because it is difficult to maintain a gap between the horizontal needles when mounting the needles onto the signal pattern.

Furthermore, there is another problem of frequency characteristics and impedance characteristics going bad because of the length of the needles 9. Also, controlling and adjusting the length, width and arrangement of the needles becomes more and more difficult and thus the failure rate increases because the needle module for testing a plurality of semiconductor IC chips is necessarily manufactured by depositing the needle layers in the second, third, and fourth level, etc., due to spatial limitations in manufacturing the needle module according to the size, arrangement, pitch and position of the pads 5, which limiteds the number of needles that can be produced. Furthermore, it is difficult to control the tension of each of the needles with a constant value.

Accordingly, due to the problems described above, there is a design limitation when pads are arranged on the semiconductor IC chip, which ultimately leads to a limitation of performance in a multi-chip test.

In FIGS, 3A & 3B, another conventional probe card is shown. The structure of a membrane-type dot probe card 3A is basically the same as that of the probe card having horizontal needles. However, in the membrane-type probe card 3A, portions contacting the pads 5 mounted on a semiconductor IC chip are not horizontal needles, but pointed bumps 13 which can softly contact the pads 5. In this case, the tension of the bumps 13 is maintained by a flexible membrane 12 which resultingly leads to a constant contact force being maintained between the bumps 13 and the pads 5. Also, as another supplementary unit for maintaining tension, a pressure maintaining adjustment tool 15 made of a pivot spring and a pressure-maintaining box cover 14 are formed on the membrane 12, for smoothly contacting the bumps 13 to the pads 5 and for prohibiting damage to the pads 5.

Although the membrane-type dot probe card provides substantial remedies for solving many drawbacks of the conventional probe card having horizontal needles, problems remain in the membrane-type dot probe card, because the structure thereof is basically that of a horizontal type. That is, the manufacturing of the membrane-type dot probe card for testing a multiple of semiconductor IC chips has limitations resulting from the limitation of the size of the membrane for maintaining the constant tension. Additionally, there is another problem in that contact failure in some parts may occur between the bumps 13 and the pads 5, because it is difficult to control the tension of the membrane 12. Also, contact failure between a wafer and a probe card may occur because the lengths of the bumps 13 may be very short.

SUMMARY OF THE INVENTION

An object of the present invention is to provide a probe card having vertical-type needles in which a notch is formed, in order to solve the above-mentioned problems of the prior art.

Another object of the present invention is to provide reliable contact between the pads and the needles.

The other object of the present invention is to allow testing a plurality of semiconductor IC chips simultaneously.

To accomplish the objects described above, a probe card of present invention comprises a vertical needle module where the vertical-type needles are attached to an upper and a lower fixing plates; a mass ring attached to the vertical needle module in order to smooth the contact of the vertical-type needles with pads of a semiconductor IC chip; a guide ring for smoothing the movement of said mass ring and the vertical needle module and for is prohibiting the mass ring and the vertical needle module from deviating in a downward direction; the means of forming a movable space for procuring movement space for the mass ring, the means positioned above the guide ring; and a PCB formed on an upper portion of the means of forming a movable space wherein a signal pattern is formed, the PCB functioning to protect the upper fixing plate against moving in a lateral direction and to protect the needle module against deviating in an upward direction.

Also, the method of manufacturing a probe card according to the present invention comprises the steps of assembling films for an upper and a lower fixing plates; inserting vertical-type needles between the films for an upper and a lower fixing plates; forming a needle module by forming the upper and lower fixing plates which are made by injecting a thermosetting resin between the films for the upper and lower fixing plates; attaching the needle module to a mass ring and assembling the needle module to a PCB in which a guide ring is attached and assembling supplementary units between said mass ring and said PCB.

BRIEF DESCRIPTION OF THE DRAWINGS

The structure and the method of the present invention will be better understood by the following description of non limitative embodiments, with reference to the attached drawings which are briefly described as follows.

DETAILED DESCRIPTION OF THE INVENTION

Figure 4A:
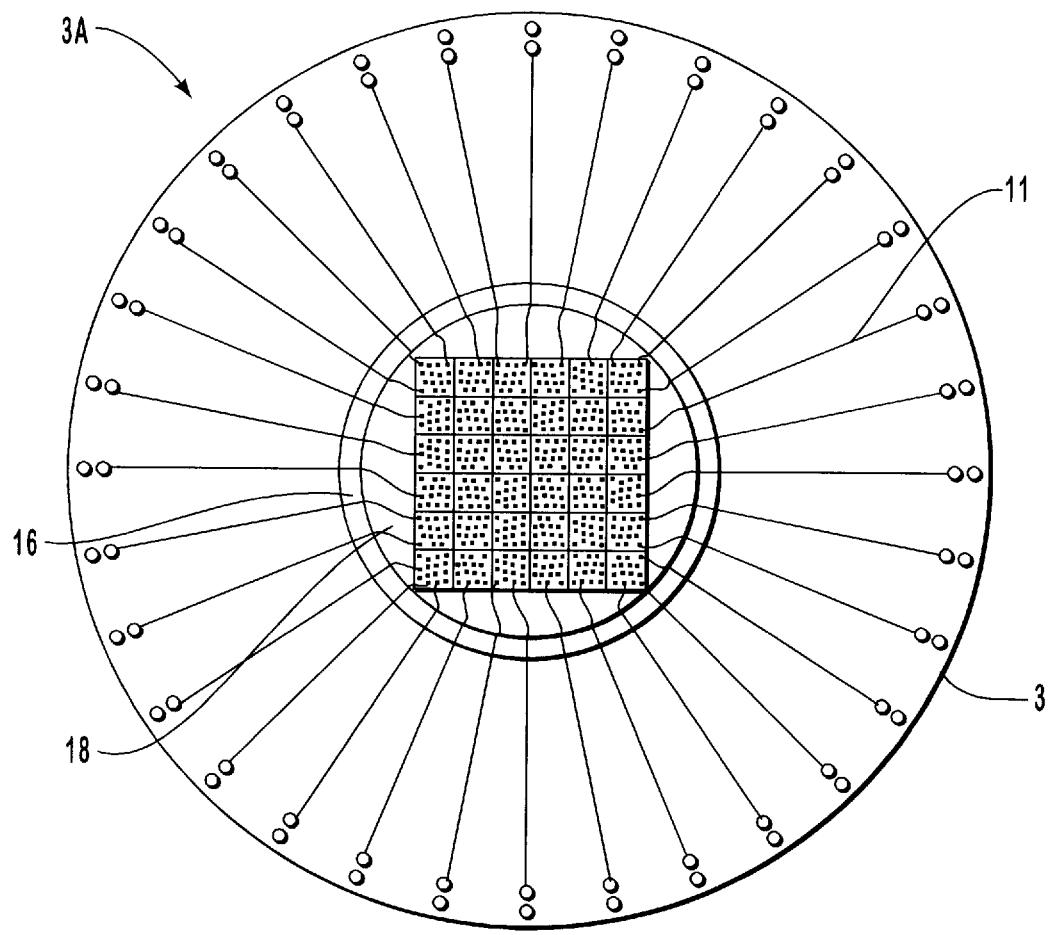
FIG. 4A is a plan view of a probe card having vertical-type needles for performing a probing test of an IC chip according to the present invention.

FIG. 4A is a plan view of a probe card having vertical-type needles according to the present invention. A guide ring 16 is fixed to a lower portion of the PCB 3 where a signal pattern 11 is formed. A vertical needle module 17 shown in FIG. 4B and a mass ring 18 are arranged at inner portions of the guide ring 16. The guide ring 16 and the mass ring 18 are respectively made of a metal, such as copper, iron, aluminum, stainless steel, or of a non-metal material such as teflon, plastic, or thermosetting resin, in consideration of weight, hardness, temperature characteristics, surface frictional force, etc., thereof.

Figure 4B:
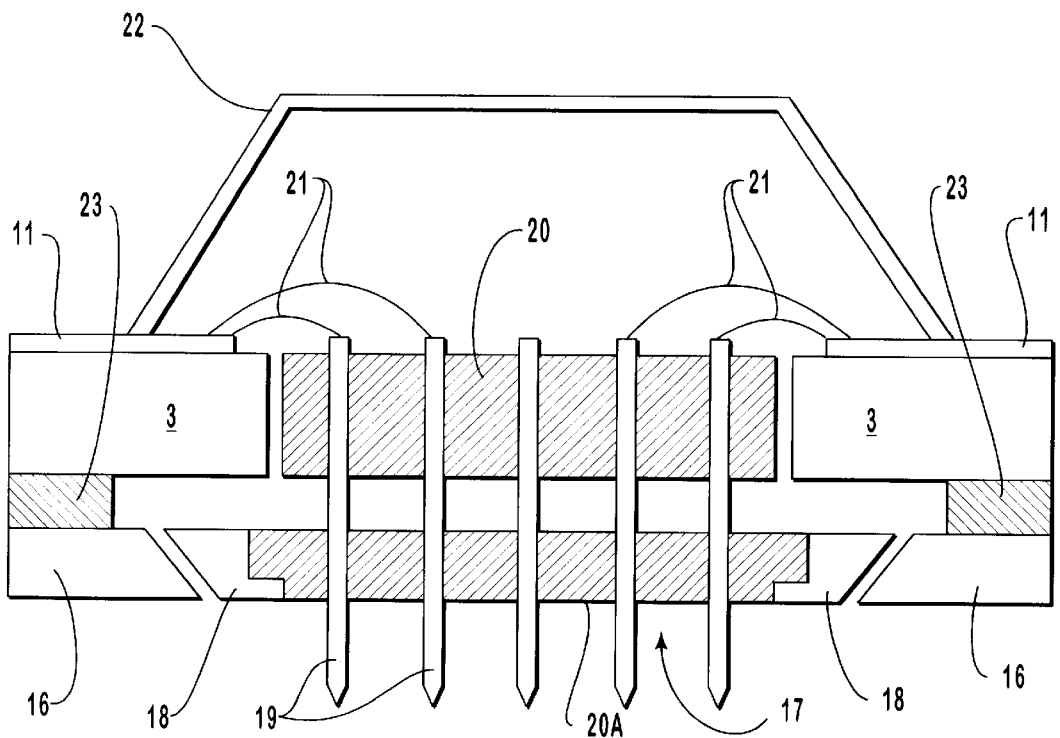
FIG. 4B is a cross-sectional view of an embodiment of the probe card having vertical type needles shown in FIG. 4A.

FIG. 4B is a cross-sectional view of an embodiment of a probe card having vertical-type needles 19. As shown in FIG. 4B, the signal pattern 11 is formed on the PCB 3. The vertical-type needles 19 are inserted through holes formed in an upper fixing plate 20 and a lower fixing plate 20A. A circular guide ring 16 is attached, by a guide ring fixing plate 23, to the lower portion of the PCB 3. The guide ring fixing plate 23 provides space for the vertical-type needles 19 to move. The space can also be used as extra space for mounting supplementary units of the mass ring 18 in order to control the whole tension of the probe card having the vertical-type needles 19. The vertical needle module 17 is formed in a central hole portion of the PCB 3. The vertical-type needles 19 are fixed in the upper fixing plate 20 and lower fixing plate 20A of the vertical-type module 17 which is attached to the mass ring 18. The signal pattern 11 is connected to each of the vertical-type needles 19 by signal lines 21. The signal lines 21 are covered and protected by a closed-type cover 22. The contact between the vertical-type needles 19 and the pads 5 shown in FIG. 1 is controlled by both the weight of the needle module 17 including the weight of the mass ring 18 and minute tension of the vertical-type needles 19 in each of which a notch 24 shown in FIG. 4C is formed, which will be described in detail later.

Figure 4C:
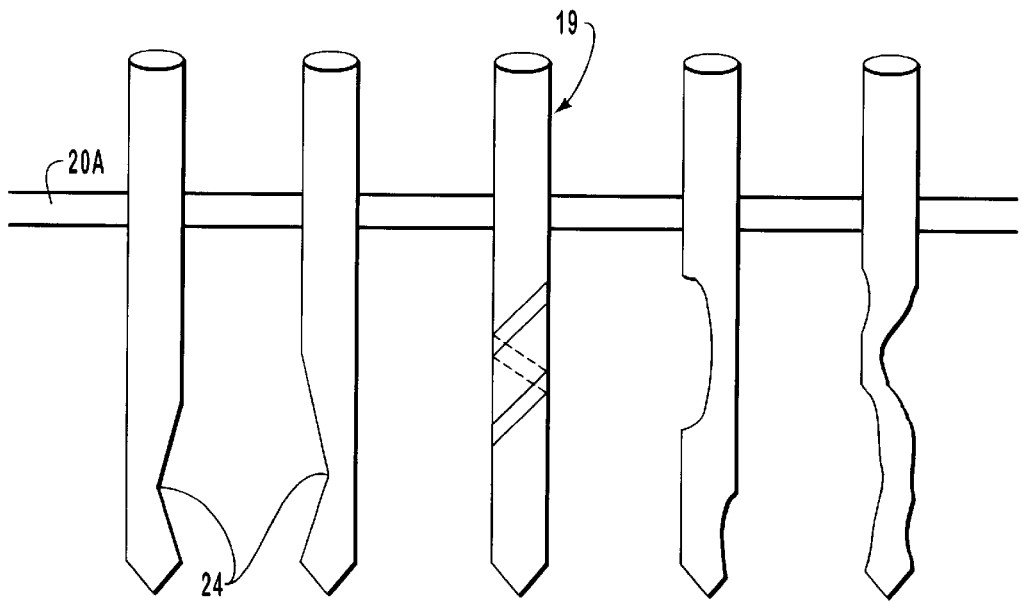
FIG. 4C is a schematic view of a plurality of needles to be used for a probe card having vertical-type needles, according to the present invention.

FIG. 4C shows a plurality of vertical-type needles 19 which are fixed to the lower fixing plate 20A. Various type of notches 24 can be formed on the vertical-type needles 19.

Figure 1:
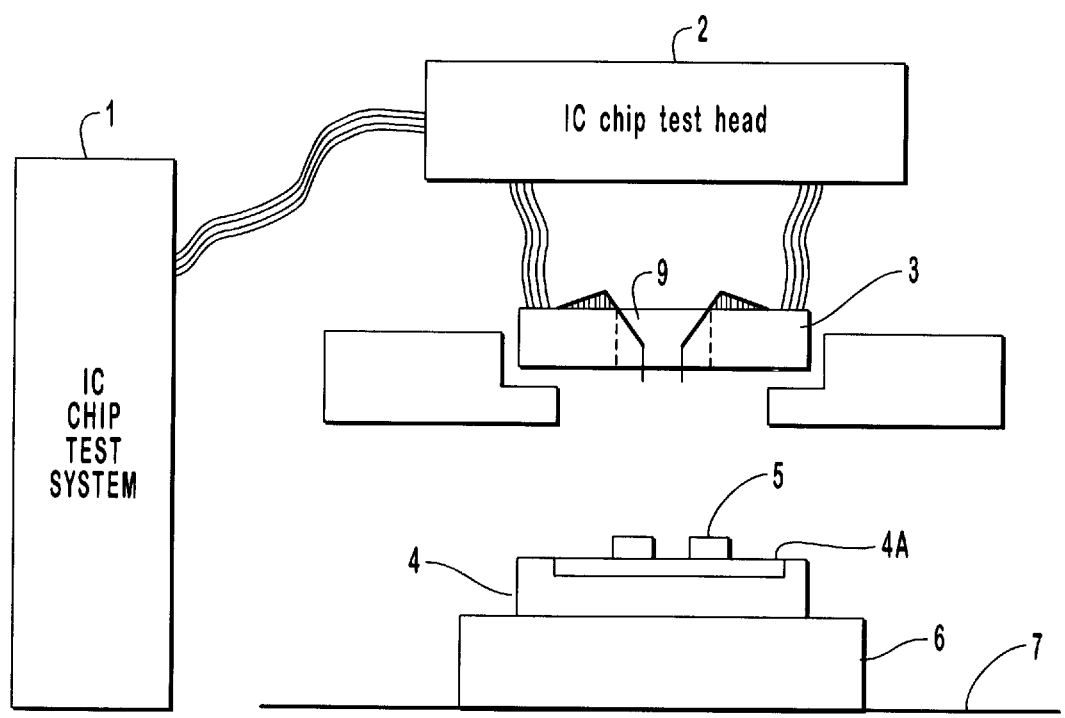
FIG. 1 is a schematic view of a general wafer probing test apparatus for performing a probing test of a IC chip.
Figure 2A:
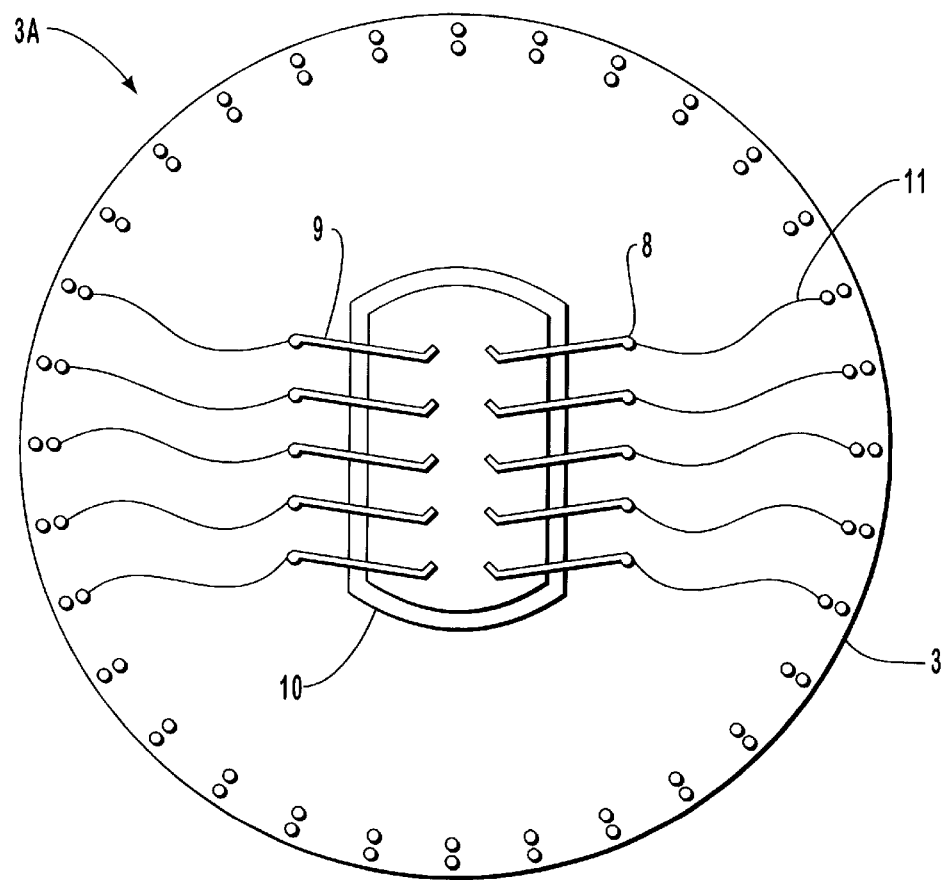
FIG. 2A is a plan view of a conventional probe card having horizontal-type needles for performing a probing test of an IC chip.
Figure 2B:
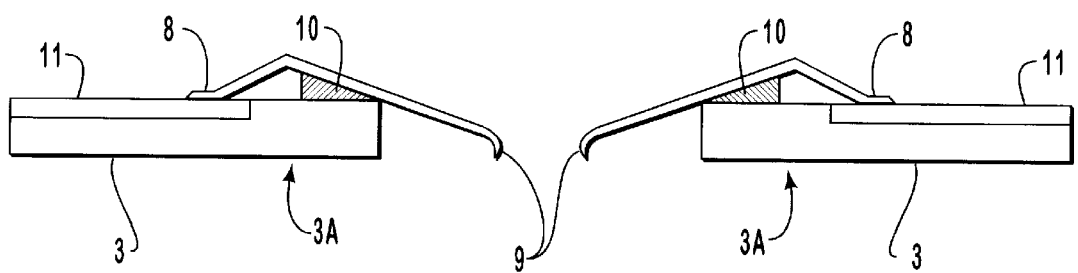
FIG. 2B is a cross-sectional view of the probe card having horizontal-type needles shown in FIG. 2A.
Figure 3A:
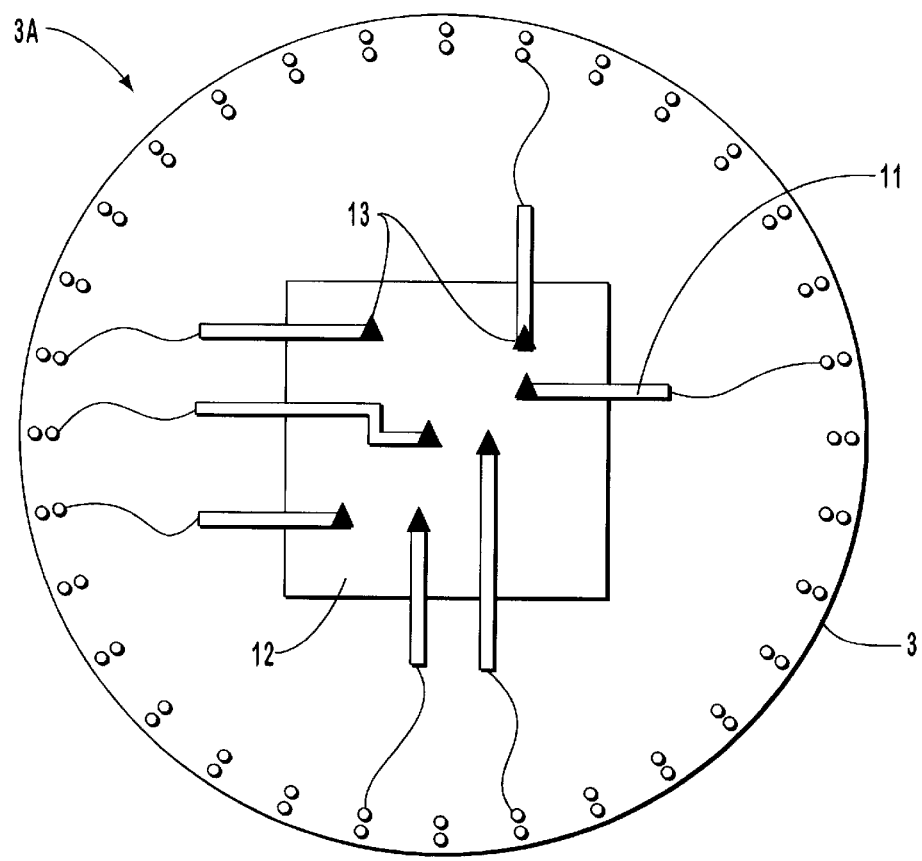
FIG. 3A is a plan view of a conventional membrane-type dot probe card for performing a probing test of an IC chip.
Figure 3B:
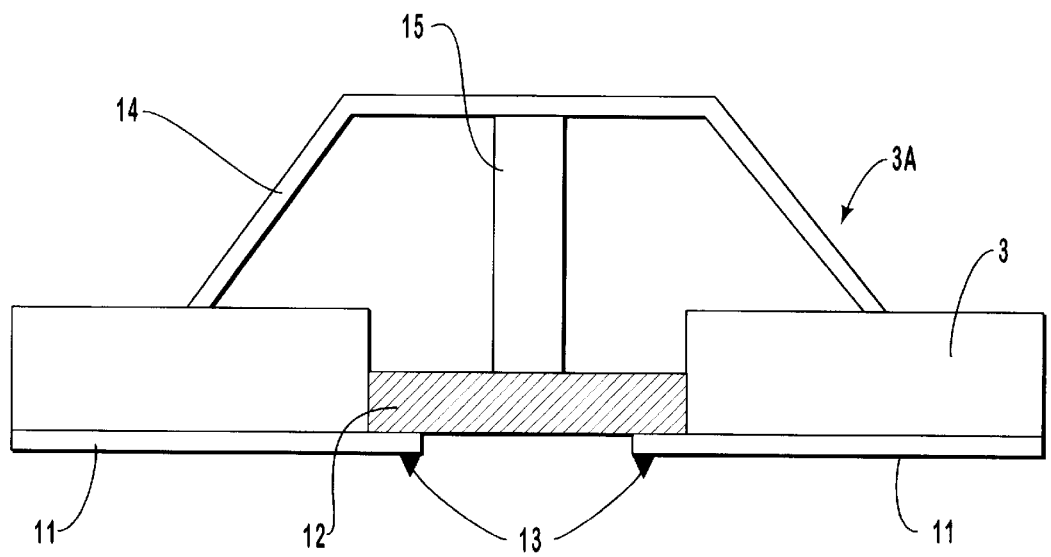
FIG. 3B is a cross-sectional view of the membrane-type dot probe card shown in FIG. 3A.

The notches 24 are for desirable contact between the vertical-type needles 19 and the pads 5 shown in FIG. 1 by elastic force due to the bending of the vertical needles 19 themselves, in addition to a mass control method which provides control of the contact forces between the pads 5 shown in FIG. 1 and the vertical-type needles 19. Also, the vertical-type needles 19 have a configuration to render minute tension in order to compensate for the height tolerance which occurs when the vertical-type needles 19 are fixed to the fixing plates 20 and 20A. Accordingly, the vertical-type needles 19 themselves are able to offset the contact failure resulting from the minute height differences.

That is, a probe card having vertical-type needles of the present invention uses a combination of a mass control method capable of controlling overall contact of the needles and a vertical-type needle notch method which use notches formed on each of the vertical-type needles and capable of controlling the minute height differences of the vertical-type needles.

Now, the method of manufacturing the needles on which notches are formed will be described. First, holes are formed through plates and vertical type needles 19 are mounted through the holes. Thereafter, a coating film such as a photoresist is deposited onto each of the vertical-type needles 19 and the coating film is removed from a desired portion of each of the vertical-type needles 19 where notches are formed, by using a photolithographic method. Next, the plates where the vertical-type needles 19 are mounted are immersed into an etching solution. After completing the etching process of the needles 19, the remaining portions of the coating films are removed by a washing solution. Finally, the vertical-type needles 19 formed with notches are obtained by separating them from the plates. For better conductivity and soldering characteristics in the final product of the vertical-type needles 19, and for prohibiting the final products of vertical-type needles 19 from oxidation and other chemical reactions as well, the vertical-type needles 19 may be plated with nickel, chromium, copper or gold.

In addition to the above method for making notches, it is also possible to make notches on the vertical-type needles 19 through precise machining or laser working.

Figure 5:
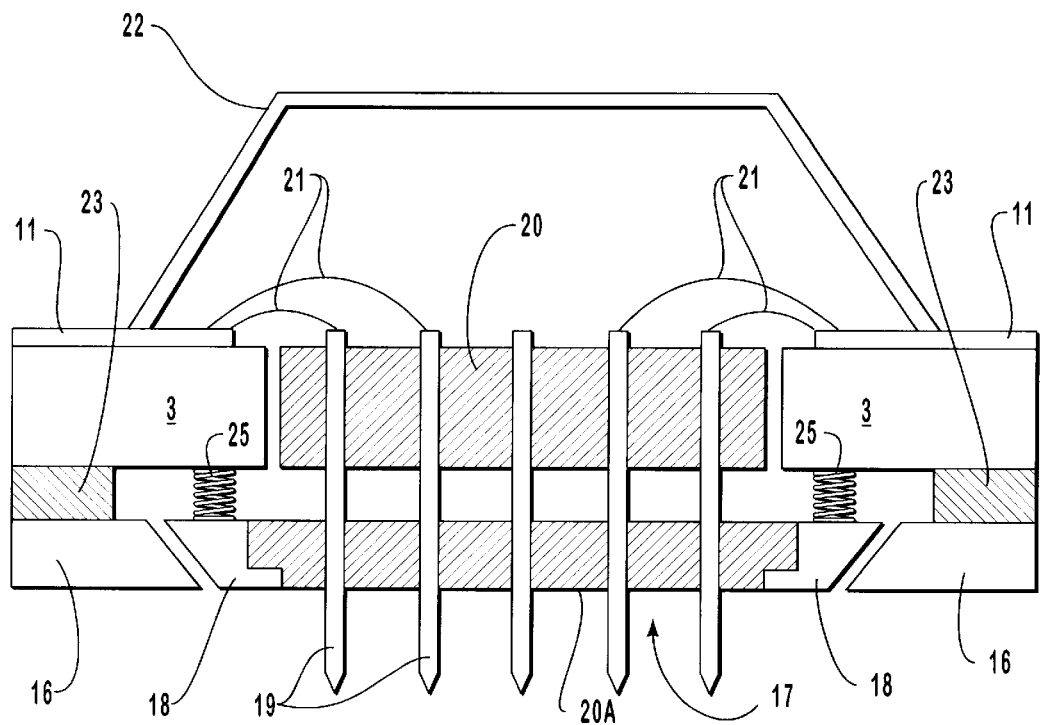
FIG. 5 is a cross-sectional view of a probe card having vertical-type needles for performing a probing test of an IC chip according to another embodiment of the present invention, where a spring controller is attached to the probe card.

FIG. 5 shows a cross sectional view of a probe card having vertical-type needles according to another embodiment of the present invention. A spring controller is incorporated into the probe card as shown in FIG. 5. That is, by additionally installing a supplementary units of control ling spring 25 such as a plate spring or a point spring or a POGO pin, between the mass ring 18 and the upper PCB 3, the overall contact tension between the pads 5 and the vertical-type needles 19 is controlled, which enables desirable contact between the pads 5 and the vertical-type needles 19, respectively, to be made.

Figure 6:
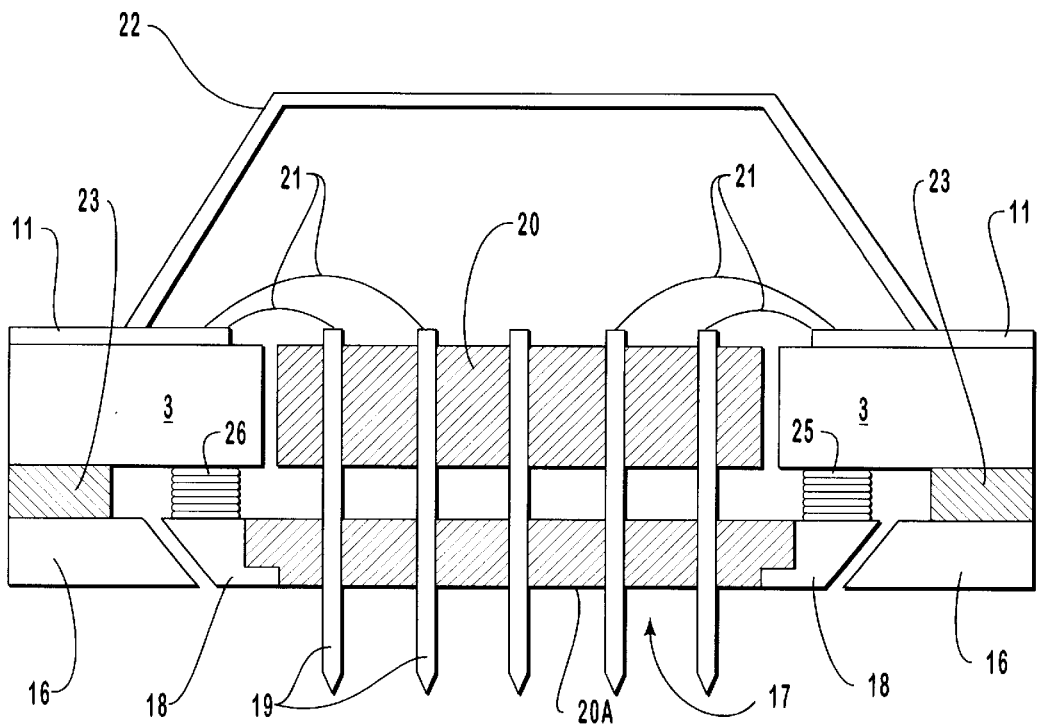
FIG. 6 is a cross-sectional view of a probe card having vertical-type needles for performing a probing test of an IC chip according to another embodiment of the present invention, where air or a liquid-sack buffer controller is attached to the probe card.

FIG. 6 shows a probe card having vertical-type needles 19 according to another embodiment of the present invention. The overall contact tension of the probe card having vertical-type needles 19 shown in FIG. 6 is controlled by a method using a buffer 26 as an air-sack or a liquid-sack, which is incorporated into the contact pressure control method using mass ring 18 shown in FIG. 4B. Accordingly, the combination of the buffer 26 and the mass ring 18 can provide good conditions of contact between the vertical-type needles 19 and the pads 5, while the pads 5 are protected against damage, to thereby test the IC 4 shown in FIG. 1.

As another alternative controlling method, a piston method which uses hydraulic pressure or atmospheric pressure may be used for controlling an overall contact tension between the pads 5 shown in FIG. 1 and the vertical-type needles 19.

As described above, the probe card having vertical-type needles according to the present invention has advantages as follows: the multi-chip probe card capable of testing a plurality of chips may be manufactured easily; the positions of the pads and the needles can be freely designed because the structure of the needle module has a matrix type; and the probe card can be produced automatically and simply so that the costs of manufacturing the probe card is low, because the probe card can be manufactured by a simple method.

While the particular probe card as herein disclosed and shown in detail are fully capable of obtaining their objects and advantages stated above, it is to be understood that the same is merely illustrative of the presently preferred embodiments of the present invention and that no limitations are intended to the details of structure or design or method herein shown other than described in the appended claims.

What is claimed is:

1. A probe card comprising:
   a vertical needle module having an upper fixing plate and a lower fixing plate through which vertical-type needles are inserted and rigidly attached, the vertical-type needles having a free end with a notch formed thereat;
   a mass ring attached to said vertical needle module for self-balancing contact with a stable force between said needles and pads of a semiconductor IC chip;
   a guide ring for smooth movement of said mass ring and said vertical needle module and for protecting said mass ring and said vertical needle module against deviation in a downward direction;
   a space forming means for obtaining a movement space in which said mass ring and said vertical needle module can freely move, said means being placed above said guide ring; and
   a probe card PCB, on which a signal pattern is formed, formed on said space forming means, thereby protecting said upper fixing plate from movements in a lateral direction and to protect said needle module against deviations in an upper direction.

2. The probe card having vertical-type needles according to claim 1, wherein a means controlled by a spring is additionally positioned between said mass ring and said probe card PCB.

3. The probe card having vertical-type needles according to claim 2, wherein said means controlled by a spring is a plate spring.

4. The probe card having vertical-type needles according to claim 2, wherein said means controlled by a spring is a point spring or a POGO pin spring.

5. The probe card according to claim 1, wherein a buffer means is additionally positioned between said mass ring and said probe card PCB.

6. The probe card having vertical-type needles according to claim 5, wherein said buffer means is an air-sack buffer.

7. The probe card according to claim 5, wherein said buffer means is a liquid-sack buffer.

8. The probe card having vertical-type needles according to claim 5, wherein said buffer means is a piston for controlling an overall tension between said pads and said vertical-type needles by using a hydraulic pressure or an atmospheric pressure.

9. The probe card according to claim 1, said probe card further comprising a closed-type cover formed on an upper portion of said probe card PCB for protecting signal lines which connect said signal pattern to each of said vertical-type needles and for controlling pressure auxiliary.

10. The probe card according to claim 1, said notch is used for controlling a minute tension between said pads and said vertical-type needles.

11. A probe card comprising:
   (a) a PCB having a top surface and a bottom surface with a hole extending therebetween;
   (b) a needle module at least partially disposed within the hole of the PCB, the needle module being freely movable relative to the PCB and comprising:
      (i) a plate having a maximum outer diameter; and
      (ii) a needle extending through the plate and being rigidly secured to the plate; and
   (c) a guide positioned on the bottom surface of the PCB about the hole, the guide having a minimum inner diameter smaller than the maximum outer diameter of the plate, thereby preventing the plate from passing the guide.

12. A probe card as recited in claim 11, wherein the guide comprises a guide ring having an annular opening extending therethrough, the opening being aligned concentrically with the hole in the PCB.

13. A probe card as recited in claim 12, wherein the guide ring has an inner surface that bounds the annular opening, the inner surface sloping radially inward.

14. A probe card as recited in claim 11, wherein the plate comprises a lower fixing plate through which the needle extends and an annular mass ring encircling the fixing plate.

15. A probe card as recited in claim 14, wherein the mass ring has an outer surface that slopes radially outward.

16. A probe card as recited in claim 14, wherein the needle module further comprises an upper fixing plate spaced apart from the lower fixing plate and rigidly attached to the needle, the upper fixing plate also being movable relative to the PCB.

17. A probe card as recited in claim 11, wherein the needle has a free end projecting from one side of the plate, the free end of the needle having a notch formed therein.

18. A probe card comprising:
   (a) a PCB having a top surface and a bottom surface with a hole extending therebetween, the hole having a minimum inner diameter;
   (b) a needle module at least partially disposed within the hole of the PCB, the needle module being freely movable relative to the PCB and comprising:
      (i) a plate having a maximum outer diameter greater than the minimum inner diameter of the hole in the PCB; and
      (ii) a needle extending through the plate and being rigidly secured to the plate, the needle having a free end projecting from one side of the plate; and
   (c) means disposed between the plate and the PCB for controlling the amount of pressure applied to the free end of the needle.

19. A probe card as recited in claim 18, wherein the means for controlling the amount of pressure applied to the free end of the needle comprises a liquid-sack disposed between the plate and the PCB.

20. A probe card as recited in claim 18, further comprising a guide ring mounted to the bottom surface of the PCB, the guide ring having an annular opening extending therethrough, and being aligned concentrically with the hole in the PCB.

21. A probe card comprising:
   (a) a PCB having a top surface and a bottom surface with a hole extending therebetween;
   (b) an annular guide ring mounted to and spaced apart from the bottom surface of the PCB by a guide ring fixing plate, the guide ring and the guide ring fixing plate each having an opening extending therethrough in concentric alignment with the hole in the PCB, the guide ring having a radially inwardly sloping surface bounding the opening thereof; and
   (c) a needle module at least partially disposed within the hole of the PCB and being freely movable therein, the needle module comprising:
      (i) a lower fixing plate having an annular mass ring encircling thereabout, the annular mass ring having a radially outwardly sloping surface complementary to the inner surface of the guide ring;
      (ii) an upper fixing plate spaced apart from the lower fixing plate; and
      (iii) a plurality of needles extending through and being rigidly secured to the upper fixing plate and the lower fixing plate, each needle having a free end with a notch formed therein.

22. A probe card as recited in claim 21, further comprising a buffer disposed between the mass ring and the PCB.

* * * * *